US006297580B1

(12) United States Patent
Takayama et al.

(10) Patent No.: US 6,297,580 B1
(45) Date of Patent: Oct. 2, 2001

(54) SURFACE ACOUSTIC WAVE DEVICE AND PRODUCTION METHOD THEREOF AND MOBILE COMMUNICATION EQUIPMENT USING IT

(75) Inventors: Ryouichi Takayama, Hirakata; Mitsuhiro Furukawa, Nishinomiya; Yuji Murashima, Neyagawa; Toru Sakuragawa, Moriguchi; Koji Nomura, Shijonawate, all of (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/446,247

(22) PCT Filed: Apr. 20, 1999

(86) PCT No.: PCT/JP99/02097

§ 371 Date: Mar. 28, 2000

§ 102(e) Date: Mar. 28, 2000

(87) PCT Pub. No.: WO99/54995

PCT Pub. Date: Oct. 28, 1999

(30) Foreign Application Priority Data

Apr. 21, 1998 (JP) ................................................ 10-110468
Apr. 21, 1998 (JP) ................................................ 10-110469

(51) Int. Cl.$^7$ .................................................. H01L 41/04
(52) U.S. Cl. ........................................... 310/364; 310/363
(58) Field of Search ..................................... 310/363, 364

(56) References Cited

U.S. PATENT DOCUMENTS 5,909,156 * 6/1999 Nishihara et al. ................... 333/193

FOREIGN PATENT DOCUMENTS

| 63-278343 | 11/1988 | (JP) | ................................ H03H/3/08 |
| 4-288718 | 10/1992 | (JP) | ................................ H03H/9/145 |
| 4-369111 | 12/1992 | (JP) | ................................ H03H/9/72 |
| 5-206776 | 8/1993 | (JP) | ................................ H03H/3/08 |
| 5-267979 | 10/1993 | (JP) | ................................ H03H/9/145 |
| 6-350373 | 12/1994 | (JP) | ................................ H03H/3/08 |
| 7-111436 | 4/1995 | (JP) | ................................ H03H/9/08 |
| 7-122961 | 5/1995 | (JP) | ................................ H03H/9/145 |
| 7-131290 | 5/1995 | (JP) | ................................ H03H/9/64 |
| 8-288781 | 11/1996 | (JP) | ................................ H03H/9/145 |
| 9-69748 | 3/1997 | (JP) | ................................ H03H/9/145 |
| 9-135143 | 5/1997 | (JP) | ................................ H03H/9/145 |
| 9-223944 | 8/1997 | (JP) | ................................ H03H/9/145 |
| 10-22764 | 1/1998 | (JP) | ................................ H03H/3/08 |
| WO 97/11526 | 3/1997 | (WO) | ................................ H03H/9/25 |

* cited by examiner

*Primary Examiner*—Thomas M. Dougherty
(74) *Attorney, Agent, or Firm*—McDermott, Will & Emery

(57) ABSTRACT

As the electrode material of a surface acoustic wave device, a laminated body laminating a second metal layer 5 on a first metal layer 4 is stacked up in two or more stages, and the first metal layer 4 is a metal of which coefficient of diffusion to Al is smaller than the coefficient of self diffusion of Al, and the second metal layer 5 is composed of an Al alloy of three elements or more containing at least one or more metals which forms solid solution with Al at ordinary temperature, and at least one or more metals forming segregation at the grain boundary of Al or an intermetallic compound with Al at ordinary temperature, and therefore the surface acoustic wave device excellent in electric power tolerance, compatible with the conventional pattern forming technology, stable thermally, and capable of preventing increase of insertion loss can be obtained.

15 Claims, 13 Drawing Sheets

Fig 1
| 1 | Piezoelectric substrate |
|---|---|
| 2 | SAW resonator |
| 2a | Comb type electrode |
| 2b | Reflector |
(a)
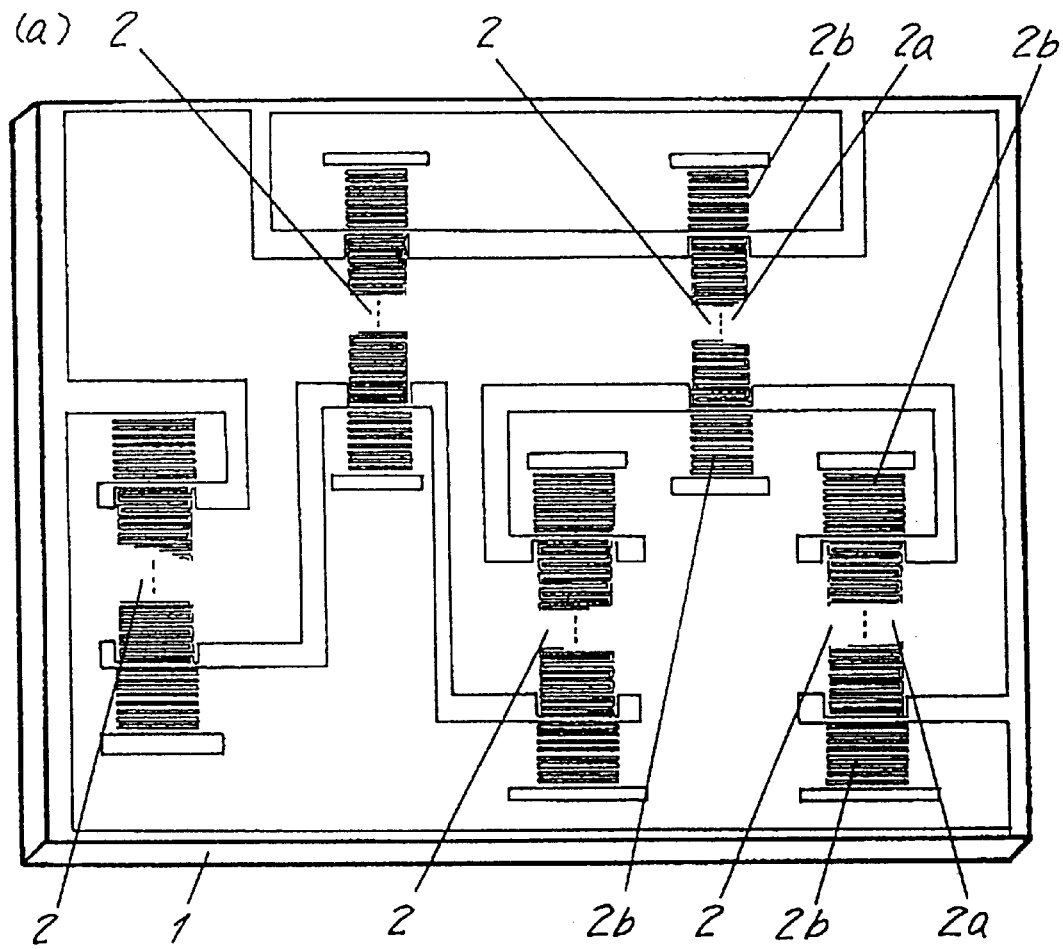
(b)
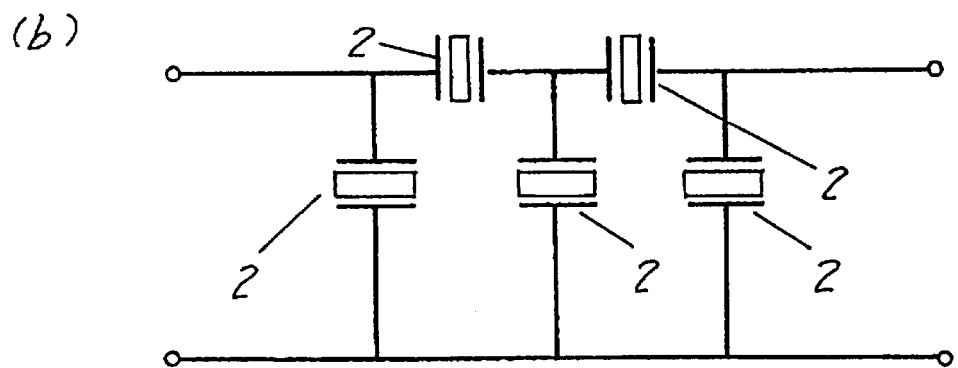

| 1 | Piezoelectric substrate | 2 | SAW resonator |
| --- | --- | --- | --- |
| 2a | Comb type electrode | 2b | Reflector |
| 6 | SAW resonators arranged in series | | |
| 7 | SAW resonators arranged in parallel | | |

Fig 13

| | |
|---|---|
| 8 | Filter characteristics |
| 9 | Impedance characteristics of resonators arranged in parallel |
| 10 | Impedance characteristics of resonators arranged in series |
| 11 | Series resonance point of parallel SAW resonators |
| 12 | Parallel resonance point of parallel SAW resonators |
| 13 | Series resonance point of series SAW resonators |
| 14 | Parallel resonance point of series SAW resonators |
| | Frequency |

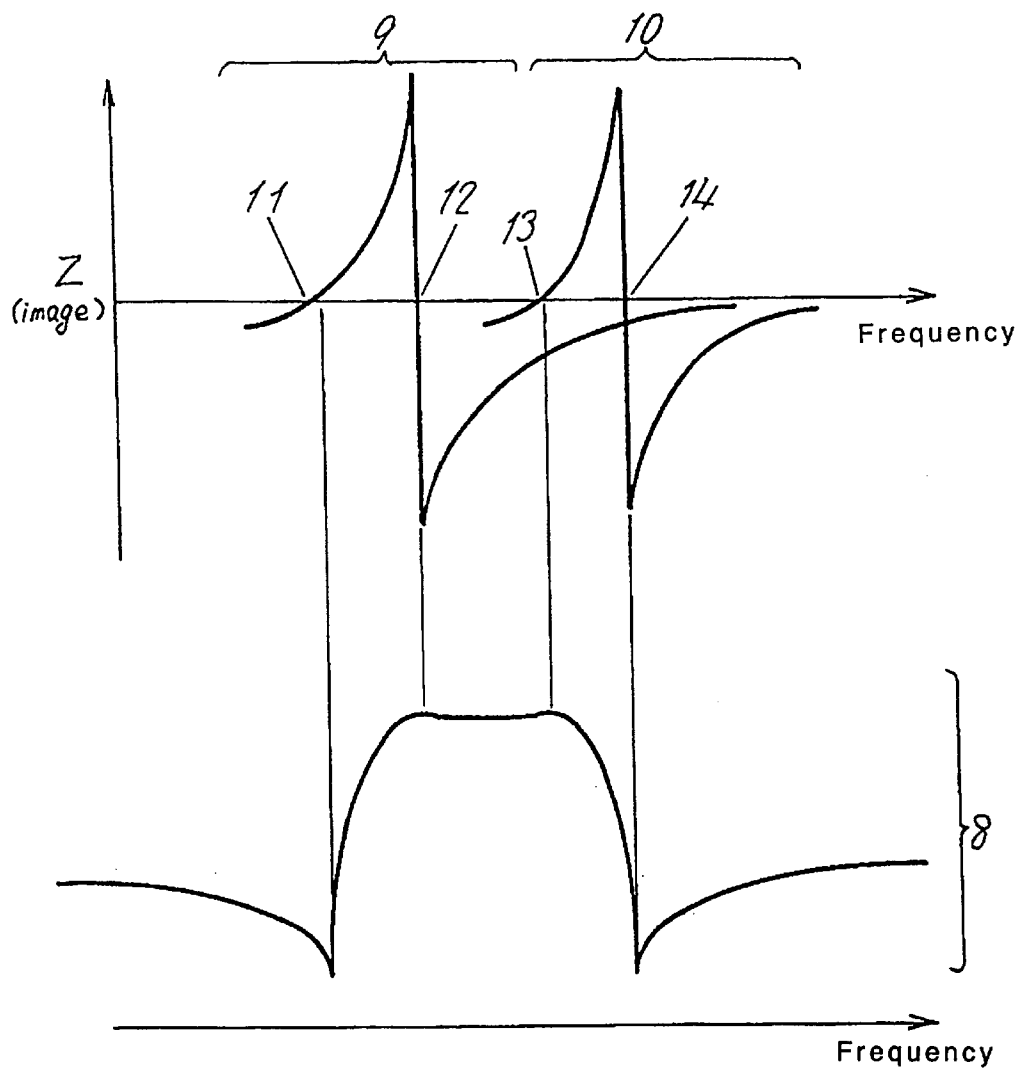

SURFACE ACOUSTIC WAVE DEVICE AND PRODUCTION METHOD THEREOF AND MOBILE COMMUNICATION EQUIPMENT USING IT

FIELD OF THE INVENTION

The invention relates to a surface acoustic wave device excellent in electric power tolerance, and more particularly a surface acoustic wave device enhanced in the electric power tolerance of the electrode, its manufacturing method, and a mobile communication equipment using the same.

BACKGROUND OF THE INVENTION

Recently, along with the trend of higher frequency of mobile communication, the operating frequency of a surface acoustic wave device (hereinafter called SAW device) is becoming higher, ranging from hundreds of MHz to several GHz. Moreover, in the antenna duplexer in which a large dielectric filter was used hitherto in order to have a sufficient electric power tolerance, it is being studied to apply the SAW device in the filter section to meet the needs of reduction of size of terminal device. However, due to increase in the operating frequency and operating power, the stress applied to the comb type electrode (IDT) of the SAW device increases, and the SAW device using the conventional electrode material had a problem in the electric power tolerance.

To solve this problem, various electrode materials have been reported, and are known to have a better electric power tolerance than the existing electrode material of Cl—Cu alloy having Cu added to Al. One of them is to use Ti, Ge, Pd or the like, instead of Cu, as the additive to Al, and to improve the electric power tolerance (for example, Japanese Laid-open Patent No. 63-278343 and Japanese Laid-open Patent No. 2-274008).

Considering, for instance, the AMPS standard which requires guarantee of operation for more than 50,000 hours by applying power of 1 W or more in the filter of the antenna duplexer, all these materials hardly satisfy the electric power tolerance sufficiently.

On the other hand, as disclosed in International Laid-open Patent No. WO97/11526, segregation of the additive Cu into the Al grain boundary by aging of Cl—Cu alloy, as known well in semiconductors, is also effective in the SAW device. In this case, too, improvement in electric power tolerance after aging is at most about several times, and the electric power tolerance is not improved sufficiently for use in the antenna duplexer.

As other means, it is attempted to improve the electric power tolerance significantly by using an electrode of three-layer structure having Cu inserted in the middle of Cl—Cu alloy, as unveiled in Japanese Laid-open Patent No. 7-122961, and in this method, although the electric power tolerance can be significantly improved, since there is the Cu layer having a specific gravity of 3.3 times that of Al in a portion of the electrode, a very strict precision of film thickness is required in manufacture, as compared with the ordinary Al (or Cl—Cu alloy), in the SAW device in which the weight of the electrode has a very large effect on the electric characteristics. Besides, since the Cu layer is used, when forming the electrode pattern, it is hard to apply the ordinary dry etching, and difficult problems exist in the manufacture and in the manufacturing yield.

Japanese Laid-open Patent No. 9-223944 is proposed to solve these problems, that is, the electric power tolerance is improved notably by the electrode formed by laminating a first film composed of an Al film or a film adding at least one other element to Al, and a second film composed of a metal of which coefficient of diffusion to Al is larger than the coefficient of self diffusion of Al. In particular, when Mg is used as the second film, it is known to solve the manufacturing problems experienced in the above case of the electrode of three-layer structure using Cl—Cu and Cu.

In this constitution, however, since the second film composed of a metal of which coefficient of diffusion to Al is larger than the coefficient of self diffusion of Al, and Al are laminated, in the heating process after forming the film, diffusion and alloying reaction may progress between Al and the metal used in the second film, the specific resistance of the electrode may be increased. Elevation of specific resistance of the electrode has a large effect on the insertion loss of the SAW device, and it is a serious problem, in particular, when fabricating a transmission side filter of the antenna duplexer in which low loss is demanded.

In addition, along with the trend of higher frequency, the line width of the IDT electrode becomes narrower, and the SAW device in which a large electric power is applied is raised in the chip temperature during operation, and a problem is also involved in the stability of electric characteristics of the SAW device. In particular, as compared with Cu, Mg is high in solid solution limit to Al, and the increase rate of specific resistance is high when incorporated in Al, and this tendency is more manifest than in the case of using Cu.

It is hence an object of the invention to present a surface acoustic wave device using an electrode excellent in electric power tolerance, compatible with the conventional pattern forming technique, stable thermally, and capable of preventing increase of insertion loss, its manufacturing method, and a mobile communication equipment using the same.

SUMMARY OF THE INVENTION

To solve the problems, the surface acoustic wave device of the invention uses an electrode formed by laminating first and second metal layers alternately on a substrate in plural layers by using a first metal layer composed of a metal of which coefficient of diffusion to Al is smaller than the coefficient of self diffusion of Al, and the second metal layer composed of an Al alloy of three elements or more containing at least one or more metals which forms solid solution with Al at ordinary temperature, and at least one or more metals forming segregation at the grain boundary of Al or an intermetallic compound with Al at ordinary temperature. It hence produces a surface acoustic wave device excellent in electric power tolerance, compatible with the conventional pattern forming technique, stable thermally, and capable of preventing increase of insertion loss.

A first aspect of the invention relates to a surface acoustic wave device having an electrode laminating at least two layers or more of a laminated body having a second metal layer stacked up on a first metal layer on a substrate, in which the first metal layer is composed of a metal of which coefficient of diffusion to Al is smaller than the coefficient of self diffusion of Al, and the second metal layer is composed of an Al alloy of three elements or more containing at least one or more metals which forms solid solution with Al at ordinary temperature, and at least one or more metals forming segregation at the grain boundary of Al or an intermetallic compound with Al at ordinary temperature. Thus by holding the second metal layer at both sides with the first metal layer of which coefficient of diffusion to Al is smaller than the coefficient of self diffusion of Al, mainly diffusion of Al atom of the second metal layer in the vertical direction to the substrate is prevented. Also by adding at least one or more metals which forms solid solution with Al at ordinary temperature in the second metal layer to enhance the mechanical strength of the second meal layer, the tolerance to the stress applied to the electrode along with propagation of surface acoustic wave is enhanced. Moreover by adding at least one or more metals forming segregation at the grain boundary of Al or an intermetallic compound with Al at ordinary temperature, mainly grain boundary diffusion of Al atom in the second metal layer in the horizontal direction to the substrate is prevented, thereby preventing deterioration of IDT electrode at the time of application of large electric power.

A second aspect of the invention relates to a surface acoustic wave device having a laminated electrode with the first metal layer held at both sides with the second metal layer, and the first and second metal layers satisfy the same conditions as in the first aspect. Therefore, it inhibits growth of continuous crystal grain boundary reaching from the interface of substrate and film to the electrode surface as in the case of single-layer film, and prevents diffusion of Al atoms in the vertical direction to the substrate of the second metal layer. It also prevents mainly grain boundary diffusion of Al atom of the second metal layer in the horizontal direction to the substrate. As a result of these actions, it is effective to prevent deterioration of IDT electrode at the time of application of large electric power.

In a third aspect of the invention, the metal layer of the remoter side from the substrate of the second metal layer is replaced by a third metal layer lower in sheet resistance than the second metal layer, composed of an Al alloy of two elements or more different in type or composition from the Al or the Al alloy for forming the second metal layer by adding at least one or more metals to the Al, and therefore the specific resistance is lowered in the entire electrode film, and the electric characteristics is enhanced as the electrode.

In a fourth aspect of the invention, the first metal layer is composed of a metal adding Al to a metal of which coefficient of diffusion to Al is smaller than the coefficient of self diffusion of Al. It prevents generation of lattice defects or pin holes formed on the first metal layer by adding Al which is a metal of low melting point, and the sheet resistance of the first metal layer is lowered, and the electric characteristics as the electrode is enhanced.

In a fifth aspect of the invention, the film thickness of the first metal layer of the lowest layer contacting with the substrate is 100 angstroms to 500 angstroms, and therefore the electric power tolerance can be further enhanced without influencing the electromechanical conversion by the first metal layer, and thereby without deteriorating the characteristics of the surface acoustic wave device.

In a sixth aspect of the invention, the film thickness of the metal layer at the closer side to the substrate of the second metal layer for composing electrode of the surface acoustic device is 2000 angstroms or less, and therefore the mechanical strength of this film is enhanced and the electric power tolerance is further enhanced by suppressing the film thickness of Al alloy for forming the second metal layer which is likely to deteriorate, suppressing the crystal growth and reducing the crystal grain size.

In a seventh aspect of the invention, the content of the metal incorporated in Al at ordinary temperature of the second metal layer is in a range not exceeding the solid solution limit at ordinary temperature, thereby preventing increase of sheet resistance of the film by excessive addition. Also the content of the metal forming segregation at the grain boundary of Al or an intermetallic compound with Al at ordinary temperature is more than the solid solution limit to Al at ordinary temperature, and therefore it is effective to define the lower limit of the content of effective action of the additive. In an eighth aspect of the invention, the second metal layer uses at least one or more metals selected from the group consisting of scandium, gallium, hafnium, zinc, lithium, zirconium, titanium and magnesium as the metal incorporated in Al at ordinary temperature, thereby enhancing the mechanical strength of the second metal layer, and at least one or more metals selected from the group consisting of germanium, copper, palladium and silicon as the metal forming segregation at the grain boundary of Al or an intermetallic compound with Al at ordinary temperature, thereby suppressing grain boundary diffusion of Al atom on the secon metal layer.

In a ninth aspect of the invention, the first metal layer is composed of a metal of high melting point (Ti, Zr, Hf, V, Nb, Ta, Cr, Mo, W, HfN, HfC, ZrN, ZrC, TaC, TiW, TiN, etc.), and therefore while preventing diffusion of Al atom from the second metal layer, the thermal stability as electrode film is obtained.

In a tenth aspect of the invention, Ti is used as the first metal layer of which coefficient of diffusion to Al is smaller than the coefficient of self diffusion of Al, with its density 1.7 times of Al at most, and in particular capable of forming a pattern by using chlorine compound etching gas used when forming Al into pattern, therefore without changing the conventional manufacturing process, the first metal film having the action of inhibiting the move of the Al atom of the second metal layer to the substrate in the vertical direction can be obtained.

In an eleventh aspect of the invention, the second metal layer uses scandium (Sc) as the metal which forms solid solution with Al at ordinary temperature, and Cu as the metal forming segregation at the grain boundary of Al or an intermetallic compound with Al at ordinary temperature, and therefore without changing the conventional manufacturing process, the mechanical characteristics of the second metal layer is enhanced, and the SAW device small in increase of specific resistance, suppressed in the grain boundary diffusion of Al atom, and excellent in electric power tolerance can be obtained.

A twelfth aspect of the invention is for heating the laminated body of first metal layer and second metal layer formed by DC magnetron sputtering method at temperature of 150 to 350° C., and therefore without breaking the structure of the laminated body and while preventing increase of particle size of the second metal layer, the additive metal in the second metal layer which forms solid solution with Al at ordinary temperature is properly solved inside the grains of Al atom, and the additive metal in the second metal layer forming segregation at the grain boundary of Al or an intermetallic compound with Al at ordinary temperature being incorporated in over-saturation just after forming of film is properly segregated in the grain boundary of Al, and therefore the action of the additive is more effectively obtained, and the electric power tolerance can be enhanced.

A thirteenth aspect of the invention relates to a surface acoustic wave filter formed by connecting surface acoustic wave resonator in series-parallel ladder type, in which a surface acoustic wave resonator disposed in series is provided in the initial stage for receiving the electric power.

Therefore, it prevents application of electric power of leak signal from the transmission side to the surface acoustic wave resonator disposed parallel in the reception side filter, which is often a problem in the reception side filter of antenna duplexer, and therefore the electric power tolerance of the surface acoustic wave resonator is enhanced, and the reception filter for antenna duplexer for the system in which the reception band is disposed at the low frequency side of the transmission band is easily realized.

In a fourteenth aspect of the invention, the surface acoustic wave device having electrode with the structure mentioned above is used in the antenna duplexer of a mobile communication equipment conventionally using a large dielectric coaxial filter due to the problem of electric power tolerance, and therefore the antenna duplexer is reduced in size and weight.

BRIEF DESCRIPTION OF THE DRAWINGS

FIG. 1 (a) is a schematic diagram of SAW filter using in embodiments 1 to 7 of the invention.

FIG. 1 (b) is a structural circuit diagram of the SAW filter used in the embodiments.

FIG. 12 (b) is a structural diagram of SAW filter used in embodiment 8.

FIGS. 13 is a conceptual diagram showing the relation between impedance characteristics and filter characteristics of SAW resonator arranged in series and SAW resonator arranged in parallel in embodiment 8.

DETAILED DESCRIPTION OF THE INVENTION

Figure 2:
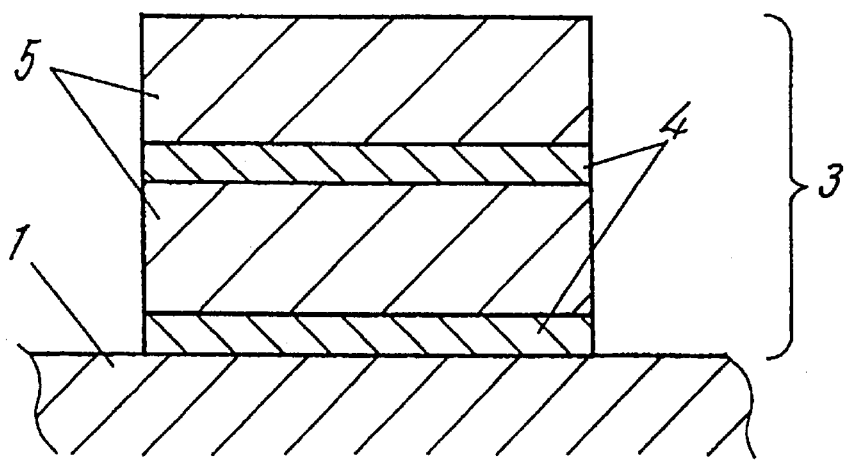
FIG. 2 is a sectional view showing an electrode construction in embodiments 1, and 4 to 7 of the invention.

Embodiments of the invention are described in detail below.

Embodiment 1

FIG. 1 (a) is a perspective view showing a constitution of ladder type SAW filter represented as SAW device in embodiment 1 of the invention. FIG. 1 (b) is its structural circuit diagram. Reference numeral 1 is a piezoelectric substrate, which is LiTaO$_3$ substrate of 36° Y cut-X propagation. Reference numeral 2 is an SAW resonator, which is composed of a comb type electrode 2a and a reflector 2b.

FIG. 2 is a sectional view of one comb type electrode, showing a basic construction of electrode in embodiment 1. In this embodiment 1, a first metal layer 4 of which coefficient of diffusion to Al is smaller than the coefficient of self diffusion of Al, and a second metal layer 5 composed of an Al alloy of three elements or more containing at least one or more metals which forms solid solution with Al at ordinary temperature, and at least one or more metals forming segregation at the grain boundary of Al or an intermetallic compound with Al at ordinary temperature are laminated in two stages as shown in FIG. 2. In this embodiment, the first metal layer is contacting with the substrate 1.

In this embodiment, samples of SAW filter shown in the following two examples were prepared.

EXAMPLE 1

The first metal layer is Ti, and the second metal layer is Cu alloy with 0.15 wt. % of Al and 1.0 wt. % of Sc.

EXAMPLE 2

The first metal layer is Ti and 0.5 wt. % of Al, and the second metal layer is Cu alloy with 0.15 wt. % of Al and 1.0 wt. % of Sc.

Herein, Sc contained in the second metal layer is a metal which forms solid solution with Al at ordinary temperature, and Cu is used as a metal forming segregation at the grain boundary of Al or an intermetallic compound with Al at ordinary temperature.

By way of comparison, at the same time, the following SAW filters were prepared in the electrode construction in FIG. 2.

Comparison 1

The first metal layer is Cu, and the second metal layer is; Cu alloy with 0.15 wt. % of Al and 1.0 wt. % of Sc.

Comparison 2

The first metal layer is Ti, and the second metal layer is Cu alloy with 1.0 wt. % of Al.

Incidentally, Cu used as the first metal layer in comparison 1 has the coefficient of diffusion to Al larger than the coefficient of self diffusion of Al. The second metal layer used in comparison 2 does not contain metal which forms solid solution with Al at ordinary temperature.

Figure 3:
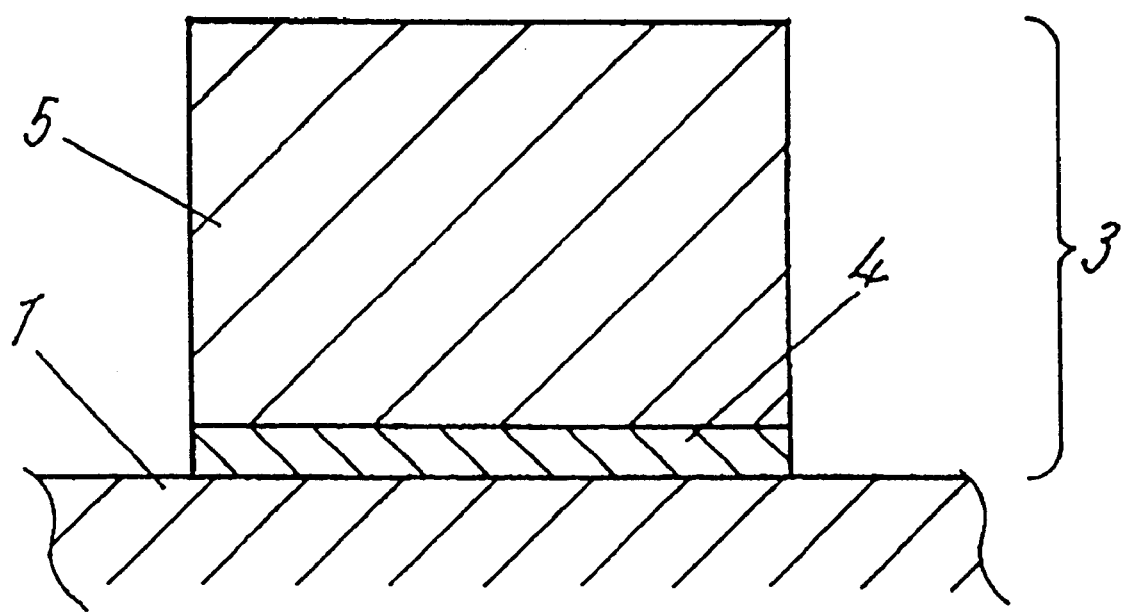
FIG. 3 is a sectional view showing a electrode construction used in comparative example in embodiment 1.

Further, as shown in FIG. 3, the following SAW filter was formed in the electrode construction of two-layer structure forming a film of first metal layer 4 on the substrate and forming a film of second metal layer 5 thereon.

Comparison 3

The first metal layer is Ti, and the second metal layer is Cu alloy with 0.15 wt. % of Al and 1.0 wt. % of Sc.

Further by way of comparison, the following samples using single-layer film as electrode were prepared.

Comparison 4

A single-layer film of Cu alloy with 1.0 wt. % of Al.

Comparison 5

A single-layer film of Cu alloy with 0.15 wt. % of Al and 1.0 wt. % of Sc.

The SAW filter was fabricated in the following procedure. Each electrode film was formed on the substrate by using DC magnetron sputtering method, and a specified pattern was formed by photolithography and drying etching method using chlorine compound etching gas. By dicing the substrate, die bond was applied to 3.8 mm square ceramic package, and electric connection was achieved by wire bonding. It was then sealed airtight by welding the lid in nitrogen atmosphere. In comparison 1, however, the pattern was formed by ion milling method because it is hard to form pattern in the Cu layer by dry etching method.

In each SAW filter prepared in the above condition, the electrode film thickness, specific resistance right after forming film, and specific resistance after forming SAW filter are shown in Table 1. For measurement of specific resistance, the sheet resistance was measured in the wafer state as for the specific resistance right after forming film, and as for the specific resistance after forming the SAW filter, the pattern for measuring the sheet resistance was prepared simultaneously when forming the filter pattern, and the sheet resistance was measured by using the one passing the same process as the SAW filter, and each, specific resistance was determined by calculation using thus measured sheet resistance and film thickness which was measured separately.

Figure 4:
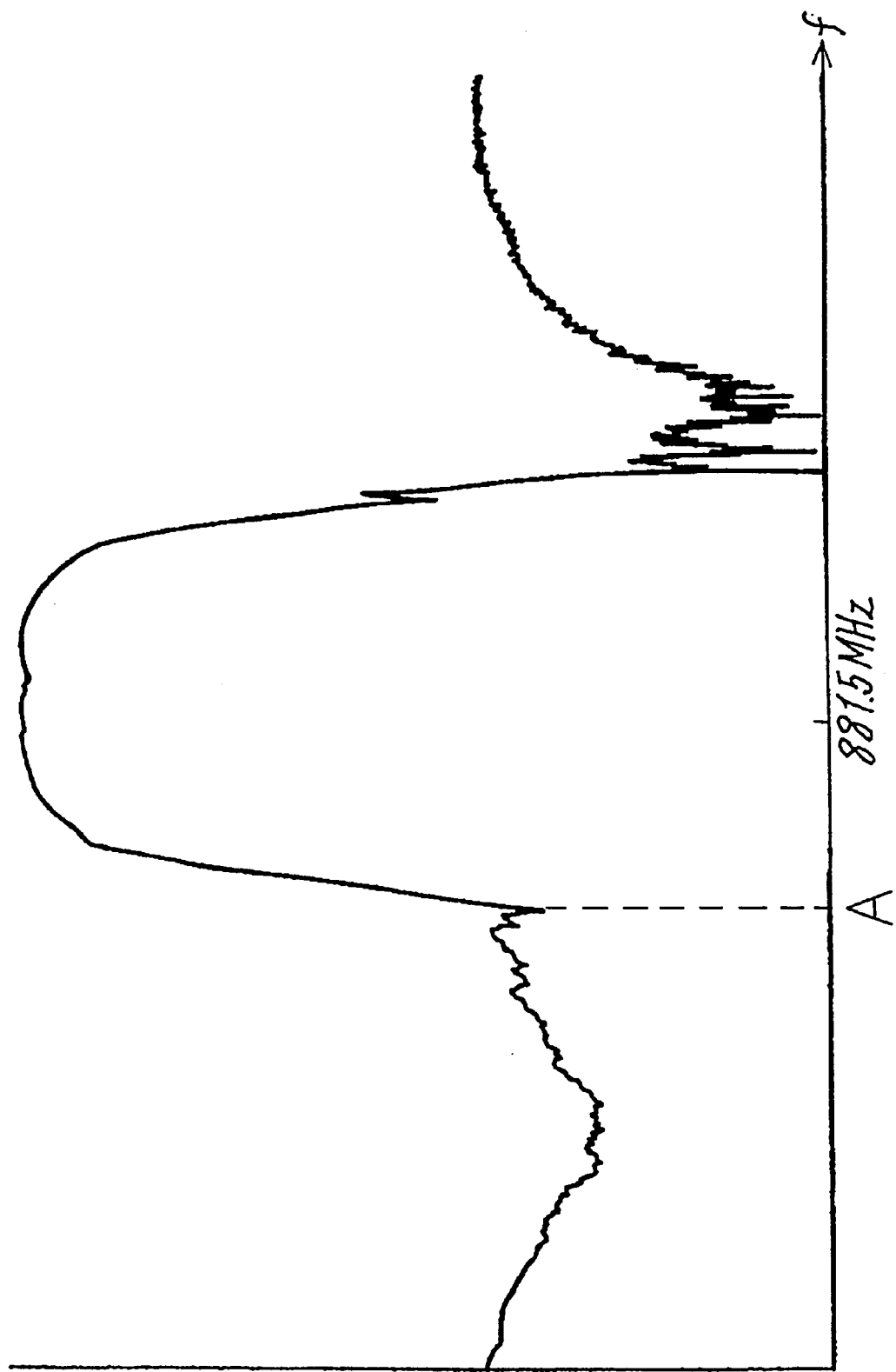
FIG. 4 is an electric characteristic diagram of reception stage SAW filter for AMPS used in the embodiments.

FIG. 4 shows the passing characteristics of the SAW filter prepared in the above method. This SAW filter is a reception side filter for antenna duplexer in the AMPS standard (reception band 869 to 894 MHz), and it is required to have enough electric power tolerance against the leak signal from the transmission side (transmission band 824 to 849 MHz).

Figure 5:
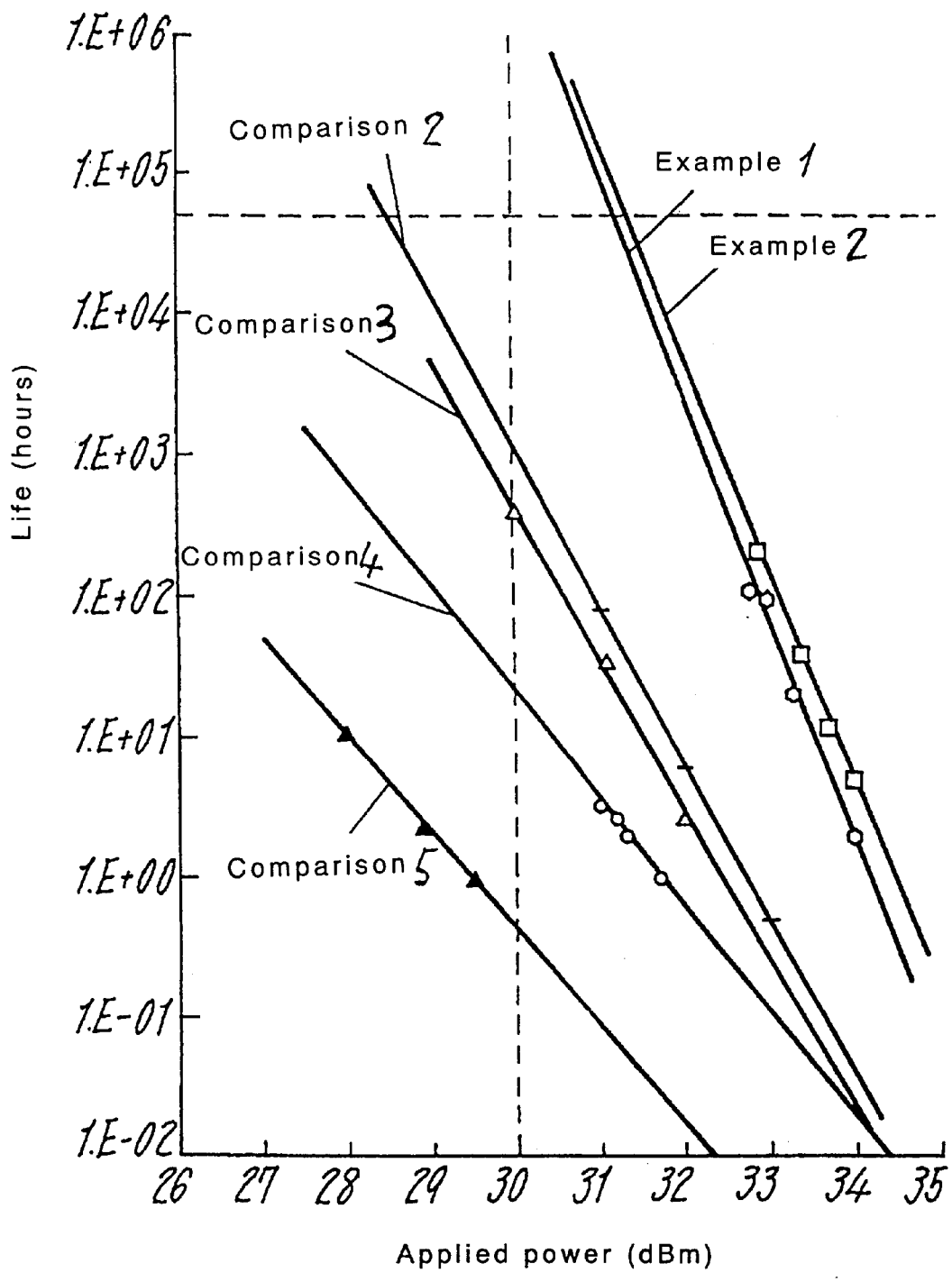
FIG. 5 is a characteristic diagram showing the relation between life of SAW filter and applied electric power in embodiment 1.

In thus prepared SAW filter, an electric power of frequency corresponding to the pole in the attenuation region (frequency indicated by A in FIG. 4) of the SAW filter at the lower frequency side from the passing band was applied, and the electric power tolerance test was conducted at ambient temperature of 85° C. At this time, the characteristics of SAW filter was measured periodically after application of electric power, and it was judged as the end of life of the SAW filter when the filter characteristics necessary as the Rx filter for antenna duplexer of .AMPS standard could not be maintained. The electric power tolerance was evaluated by applying various levels of electric power, measuring the life in each condition, and predicting the life at 1 W application according to Arrhenius model. Herein, a guideline of life is 50,000 hours at 1 W. The relation between the obtained life and applied power is shown in FIG. 5. In FIG. 5, 30 dBm corresponds to 1 W.

TABLE 1

| | Electrode material Film thickness of each layer (Å) | Electrode construction | Specific resistance Right after forming film ($\mu\Omega \cdot cm$) | Specific resistance After making device ($\mu\Omega \cdot cm$) |
|---|---|---|---|---|
| Example 1 | Substrate/Ti/Al-0.15 wt % Sc-1.0 wt % Cu/Ti/Al-0.15 wt % Sc-1.0 wt % Cu (Substrate/200/1700/200/1700) | FIG. 2 | 3.91 | 3.90 |
| Example 2 | Substrate/Ti-0.5 wt % Al/Al-0.15 wt % Sc-1.0 wt % Cu/Ti-0.5 wt % Al/Al-0.15 wt % Sc-1.0 wt % Cu (Substrate/200/1700/200/1700) | FIG. 2 | 3.72 | 3.70 |
| Comparison 1 | Substrate/Cu/Al-0.15 wt % Sc-1.0 wt % Cu/Cu/Al-0.15 wt % Sc-1.0 wt % Cu (Substrate/200/1320/200/1320) | FIG. 2 | 3.63 | 7.01 |
| Comparison 2 | Substrate/Ti/Al-1.0 wt % Cu/Ti/Al-1.0 wt % Cu (Substrate/200/1700/200/1700) | FIG. 2 | 3.88 | 3.86 |
| Comparison 3 | Substrate/Ti/Al-0.15 wt % Sc-1.0 wt % Cu (Substrate/200/3700) | FIG. 3 | 3.43 | 3.42 |
| Comparison 4 | Substrate/Al-0.15 wt % Sc-1.0 wt % Cu (Substrate/4000) | Single-layer film | 3.41 | 3.41 |
| Comparison 5 | Substrate/Al-1.0 wt % Cu (Substrate/4000) | Single-layer film | 3.32 | 3.32 |

As known from FIG. 5, example 1 and example 2 sufficiently satisfied the guideline of 50,000 hours although there is a slight difference between them, whereas the electric power tolerance is insufficient in SAW filters of comparison 2, comparison 3, comparison 4 and comparison 5. In comparison 1, the electrode film was separated from the substrate in the dicing process, and it was impossible to measure the characteristics, and since the lowest layer was Cu, it was found that there was a problem in adhesion to the substrate. After testing, the electrode portions of the SAW filters were observed by scanning electron microscope (SEM), and segregations of Al atoms were observed as hillocks on the face and side surfaces of electrodes in comparison 3, comparison 4, and comparison 5, and in comparison 2, although segregation of Al atom was not recognized in the upper layer of the electrode film, segregation of Al atom was observed in the horizontal direction to the substrate as side hillock from the second metal layer. Hillocks and migrations are induced by application of stress to the electrode by the surface acoustic wave propagating through the substrate and heat generation during operation.

Thus, when the metal which forms solid solution with Al at ordinary temperature was not contained in the second metal layer (comparison 2), when the second metal layer was not covered with the first metal layer (comparison 3), or when the electrode was El single layer (comparisons 4, 5), it was found that segregation of Al atoms could not be suppressed, and the electric power tolerance was insufficient.

In examples 1 and 2, as shown in Table 1, there was almost no change in the specific resistance right after forming the film and after making the SAW filter. In comparison 1, by contrast, the specific resistance after forming the device was increased as compared with the specific resistance right after forming the film. This is because the Cu used as the first metal layer diffused into the second metal layer and made alloying reaction by heat treatment in the process, which increased the resistance of the second metal layer.

In example 2, as compared with example 1, the specific resistance is suppressed lower, which is considered because Ti which is a metal of high melting point is likely to form pin hole or lattice defect, but by adding a trace of Al which is a metal of low melting point, Al atoms penetrate into the pin holes and lattice defects, thereby lowering the specific resistance of the first metal layer (Al alloy with 0.5 wt. % of Ti) than the specific resistance of the first metal layer (Ti) in example 1. This effect is obtained by adding a metal of low melting point represented by Al by about 0.1 to 5.0 wt. % to the first metal layer which is a metal of high melting point.

Thus, for enhancement of electric power tolerance of SAW filter, it is effective to use the electrode formed by laminating the first metal layer and second metal layer in plural layers. To suppress the elevation of specific resistance of electrode film in heat treatment in the manufacturing process, the first metal layer is required to be composed of a metal of which coefficient of diffusion to Al is smaller than the coefficient of self diffusion of Al. As for the second metal layer, it is preferred, by incorporating the additive which forms solid solution with Al in the grains of principal component of Al, to enhance the mechanical characteristics and decrease effects by stress, and also it is preferred to add a metal for forming segregation at the grain boundary of Al or an intermetallic compound with Al, thereby suppressing migration of Al atoms in the horizontal direction to the substrate.

In the embodiment, a laminated body of second metal layer stacked up on first metal layer is laminated in two layers, but similar effects are obtained by laminated in more than two layers, evidently. As a result, the process becomes longer, but the mechanical strength of the electrode can be further enhanced.

Embodiment 2

Figure 6:
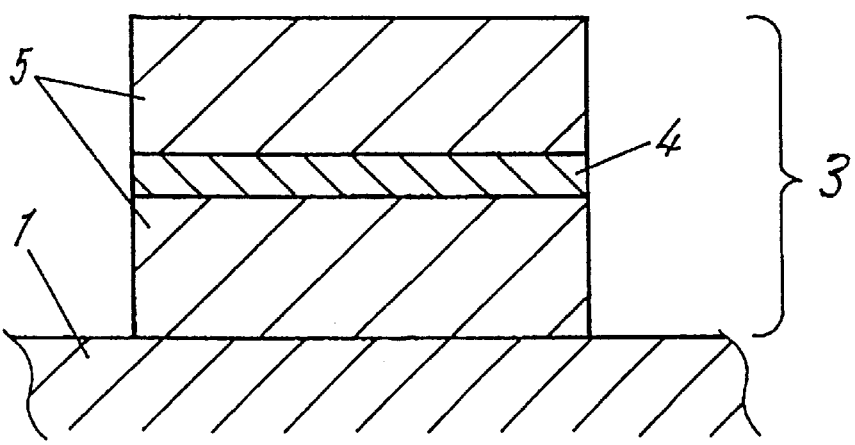
FIG. 6 is a sectional view showing an electrode construction of embodiment 2.

The constitution of the SAW filter in embodiment 2 is same as in embodiment 1 shown in FIG. 1, and only the electrode construction is different as shown in FIG. 6. That is, in this embodiment, the both side of the first metal layer 4 are held by the second metal layer, and formed on the substrate 1. In this embodiment, too, the first metal layer 4 is made of a metal of which coefficient of diffusion to Al is smaller than the coefficient of self diffusion of Al, and the second metal layer 5 is composed of an Al alloy of three elements or more containing at least one or more metals which forms solid solution with Al at ordinary temperature, and at least one or more metals forming segregation at the grain boundary of Al or an intermetallic compound with Al at ordinary temperature. In this embodiment, samples of SAW filter shown in the following two examples were prepared.

EXAMPLE 3

The first metal layer is Ti, and the second metal layer is Cu alloy with 0.15 wt. % of Al and 1.0 wt. % of Sc.

EXAMPLE 4

The first metal layer is Ti and 0.5 wt. % of Al, and the second metal layer is Cu alloy with 0.15 wt. % of Al and 1.0 wt. % of Sc.

By way of comparison, at the same time, the following samples were prepared in the electrode construction shown in FIG. 6.

Comparison 6

The first metal layer is Cu, and the second metal layer is Cu alloy with 0.15 wt. % of Al and 1.0 wt. % of Sc.

Comparison 7

The first metal layer is Ti, and the second metal layer is Cu alloy with 1.0 wt. % of Al.

Table 2 shows the electrode film thickness of each SAW filter, specific resistance right after forming film, and specific resistance after making SAW filter. The specific resistance was measured in the same manner as in embodiment 1.

The SAW filters were fabricated in the same manner as in embodiment 1. In thus prepared SAW filters, the electric power tolerance test was conducted in the same manner as in embodiment 1. The relation between the obtained life and applied power is shown in FIG. 7.

Figure 7:
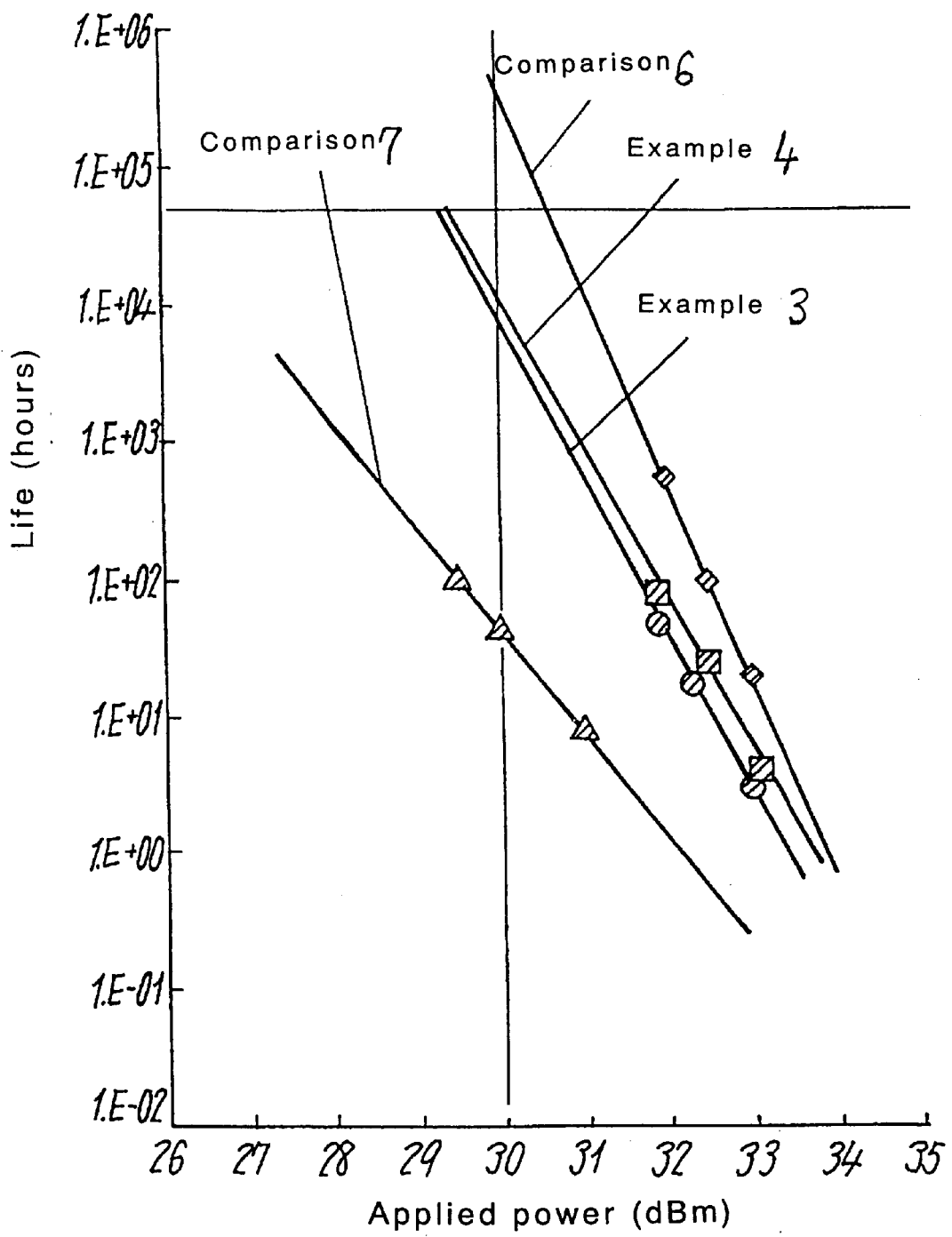
FIG. 7 is a characteristic diagram showing the relation between life of SAW filter and applied electric power in embodiment 2.

As clear from FIG. 7, it is known that comparison 6 and examples 3 and 4 are superior to comparison 7 in electric power tolerance. Comparison 6 satisfied the requirements of 1 W, 50,000 hours, and it is sufficient from the viewpoint of life only, and it can be sufficiently used as the Rx filter of antenna duplexer conforming to AMPS standard. Examples 3 and 4 are also in a sufficiently practicable range by changing the circuit design as mentioned later in embodiment 8.

As known from comparison between FIG. 7 and FIG. 5 showing embodiment 1, concerning the life, examples 1 and 2 of embodiment 1 are longer than examples 3 and 4. It is considered because it; is stronger against stress and migration occurs hardly when the metal layer contacting with the substrate is the first metal layer composed of a metal of which coefficient of diffusion to Al is smaller than the coefficient of self diffusion of Al, rather than the second metal layer mainly composed of Al.

After testing the SAW filters, the electrode portions were observed by scanning electron microscope (SEM), and in comparison 7, although the electrode surface was normal, segregation of Al atoms was observed on the side surface as side hillock of the second metal layer.

On the other hand, as known from Table 2, in examples 3 and 4, there was almost no change in the specific resistance right after forming the film and after making the SAW filter, but in comparison 6 using Cu, although the specific resistance was low right after forming the film, the specific resistance was largely increased after making the SAW filter. This is considered because Cu of the first metal layer diffused into the second metal layer and made alloying reaction with the principal component Al of the second metal layer in the heating process in the SAW filter manufacturing steps.

To investigate the effects of specific resistance, using electrode films of examples 3 and 4 and comparison 6, transmission side filters for antenna duplexer conforming to AMPS standard (transmission band 824 to 849 MHz) were fabricated, and the insertion loss in the transmission band was investigated. Results are shown in Table 3. Table 3 also shows results of examples 1 and 2 of embodiment 1.

TABLE 2

| | Electrode material Film thickness of each layer (Å) | Electrode construction | Specific resistance Right after forming film (μΩ·cm) | Specific resistance After making device (μΩ·cm) |
|---|---|---|---|---|
| Example 3 | Substrate/Al-0.15 wt % Sc-1.0 wt % Cu/Ti/Al-0.15 wt % Sc-1.0 wt % Cu (Substrate/1900/200/1900) | FIG. 6 | 3.61 | 3.61 |
| Example 4 | Substrate/Al-0.15 wt % Sc-1.0 wt % Cu/Ti-0.5 wt % Al/Al-0.15 wt % Sc-1.0 wt % Cu (Substrate/1900/200/1900) | FIG. 6 | 3.53 | 3.51 |
| Comparison 6 | Substrate/Al-0.15 wt % Sc-1.0 wt % Cu/Cu/Al-0.15 wt % Sc-1.0 wt % Cu (Substrate/1700/200/1700) | FIG. 6 | 3.52 | 6.65 |
| Comparison 7 | Substrate/Al-1.0 wt % Cu/Ti/Al-1.0 wt % Cu (Substrate/1900/200/1900) | FIG. 6 | 3.45 | 3.45 |

TABLE 3

| | Electrode material Film thickness of each layer (Å) | Electrode construction | Insertion loss (dB) max. | Insertion loss (dB) min. |
|---|---|---|---|---|
| Example 3 | Substrate/Al-0.15 wt % Sc-1.0 wt % Cu/Ti/Al-0.15 wt % Sc-1.0 wt % Cu (Substrate/1900/200/1900) | FIG. 6 | 2.21 | 1.25 |
| Example 4 | Substrate/Al-0.15 wt % Sc-1.0 wt % Cu/Ti-0.5 wt % Al/Al-0.15 wt % Sc-1.0 wt % Cu (Substrate/1900/200/1900) | FIG. 6 | 2.19 | 1.23 |
| Comparison 6 | Substrate/Al-0.15 wt % Sc-1.0 wt % Cu/Cu/Al-0.15 wt % Sc-1.0 wt % Cu (Substrate/1700/200/1700) | FIG. 6 | 3.10 | 2.20 |
| Example 1 | Substrate/Ti/Al-0.15 wt % Sc-1.0 wt % Cu/Ti/Al-0.15 wt % Sc-1.0 wt % Cu (Substrate/200/1700/200/1700) | FIG. 2 | 2.23 | 1.31 |
| Example 2 | Substrate/Ti-0.5 wt % Al/Al-0.15 wt % Sc-1.0 wt % Cu/Ti-0.5 wt % Al/Al-0.15 wt % Sc-1.0 wt % Cu (Substrate/200/1700/200/1700) | FIG. 2 | 2.21 | 1.28 |

As known from Table 3, SAW filter in comparison 6 using Cu showed larger values of both minimum and maximum insertion losses in transmission band, compared with SAW filters in examples 3 and 4 using Ti as the first metal. This is considered because the specific resistance of the electrode film is higher as mentioned above.

Using the electrode films of examples 3 and 4 and comparison 6 forming the SAW filters, resonators alone were fabricated, and similarly, as compared with the SAW filters of examples 3 and 4, comparison 6 using Cu was inferior in the Q value as the resonator. As a result, the electrode of comparison 6 was satisfactory in the aspect of life, but inferior in insertion loss and Q value, and it was found there were problems to be used as electrode material of transmission side filter for antenna duplexer. From the viewpoint of insertion loss, meanwhile, examples 3 and 4 of embodiment 2 are not inferior to examples 1 and 2 of embodiment 1 as clear from Table 3.

Thus, according to embodiment 2, when used in combination with the circuit arrangement mentioned in embodiment 8 later, the SAW filter satisfying the electric power tolerance and excellent in transmission characteristics may be realized in a simpler electrode construction than in embodiment 1.

Embodiment 3

Figure 8:
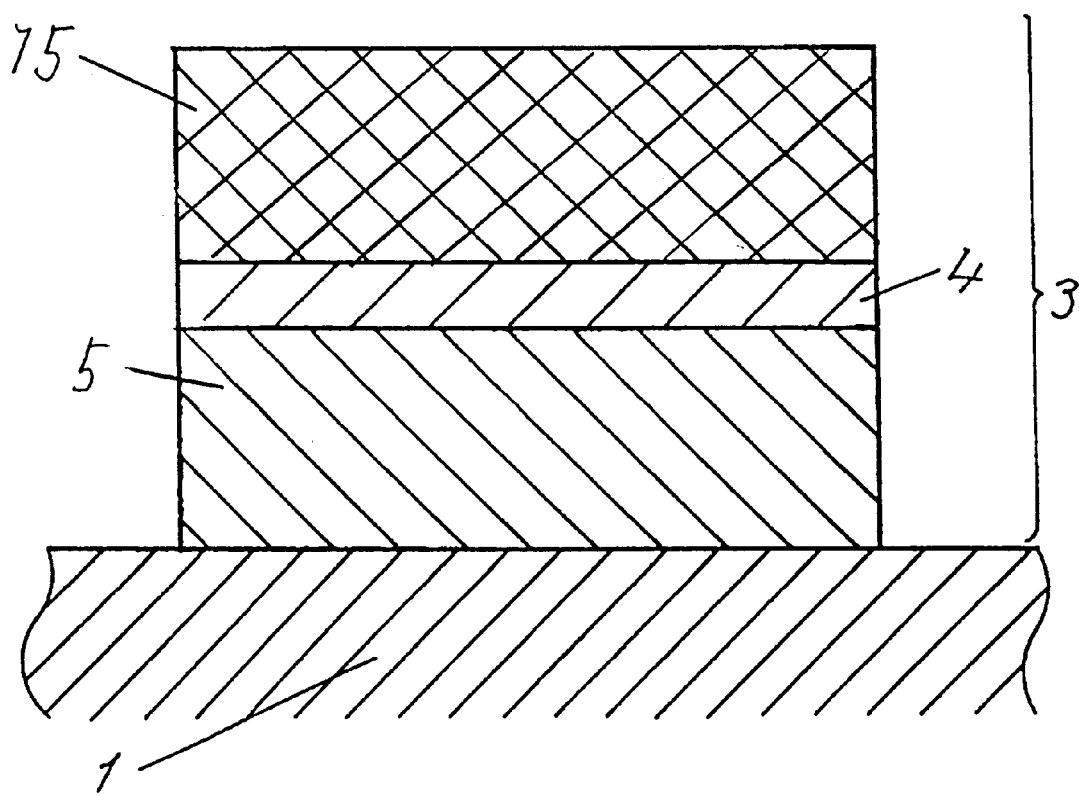
FIG. 8 is a sectional view showing an electrode construction of embodiment 3.
Figure 9:
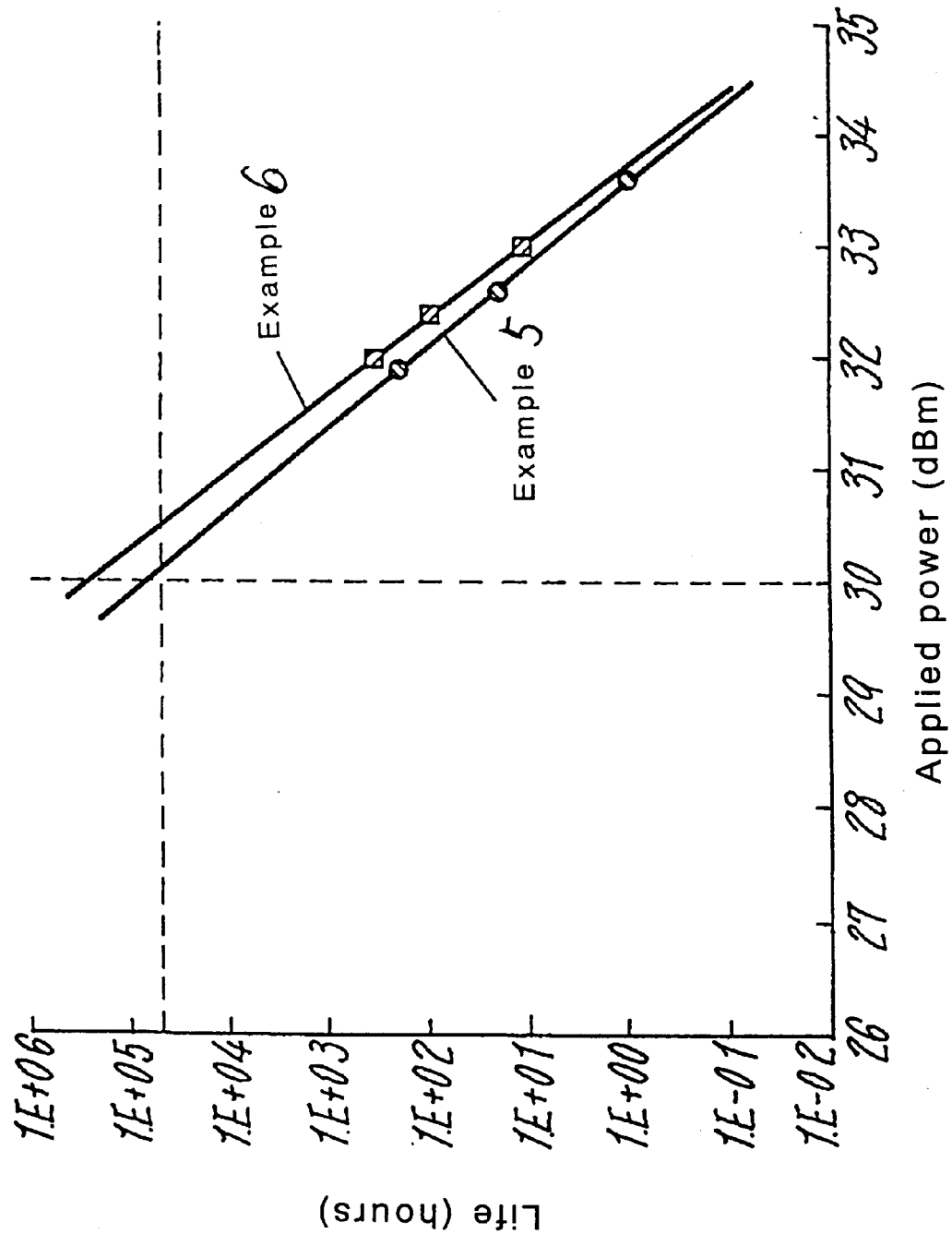
FIG. 9 is a characteristic diagram showing the relation between life of SAW filter and applied electric power in embodiment 3.

The constitution of the SAW filter in embodiment 3 is shown in FIG. 8, in which the electrode is composed by laminating a first metal layer 4, a second metal layer 5, and a third metal layer 15. Same as in the foregoing embodiments, the first metal layer 4 is made of a metal of which coefficient of diffusion to Al is smaller than the coefficient of self diffusion of Al, and the second metal layer 5 is composed of an Al alloy of three elements or more containing at least one or more metals which forms solid solution with Al at ordinary temperature, and at least one or more metals forming segregation at the grain boundary of Al or an intermetallic compound with Al at ordinary temperature. The third metal layer 15 is composed of Al or Al alloy lower in sheet resistance than the second metal layer.

In this embodiment, samples of SAW filter shown in the following two examples were prepared.

EXAMPLE 5

The first metal layer 4 is Ti, the second metal layer 5 is Cu alloy with 0.15 wt. % of Al and 1.0 wt. % of Sc, and the third metal layer 15 is Al.

EXAMPLE 6

The first metal layer 4 is Ti, the second metal layer 5 is Cu alloy with 0.15 wt. % of Al and 1.0 wt. % of Sc, and the third layer 15 is Cu alloy with 1.0 wt. % of Al.

Reception side filters for antenna duplexer conforming to AMPS standard and transmission side filter for antenna duplexer conforming to AMPS standard were fabricated, and the life was measured in the same manner as in embodiment 1. Table 4 shows the specific resistance after forming film and after making SAW filter, and the insertion loss in the transmission band of the transmission side filter for antenna duplexer, and FIG. 3 shows the relation between the life and applied power in evaluation of electric power tolerance in the reception side filter for antenna duplexer.

In both embodiments 5 and 6, although the electric power tolerance is lower than in examples 1 and 2, they satisfy the requirements of 50.000 hours at 1 W, and are sufficiently usable. As clear from comparison between Table 4 and Table 1, the specific resistance as electrode film is improved as compared with examples 1 and 2, and the insertion loss is lowered as the transmission side filter for antenna duplexer.

In the electrode structure (FIG. 6) used in embodiment 2, if the second metal layer positioned at the highest layer is replaced by the third metal layer of lower sheet resistance, the same effects are obtained.

Embodiment 4

In embodiment 4 of the invention, Ti was used as the first metal layer of which coefficient of diffusion to Al is smaller than the coefficient of self diffusion of Al, and Cu alloy with 0.15 wt. % of Al and 1.0 wt. % of Sc was used as the second metal layer composed of an Al alloy of three elements or more containing at least one or more metals which forms solid solution with Al at ordinary temperature, and at least one or more metals forming segregation at the grain boundary of Al or an intermetallic compound with Al at ordinary temperature, and moreover an electrode film having an electrode construction as shown in FIG. 2 was used. The film thickness of the first metal layer (Ti layer) contacting with the substrate was varied in a range of 50 to 500 angstroms. At this time, the first metal layer (Ti layer) not contacting with the substrate was fixed at 200 angstroms, and the film thickness of the second metal layer (Cu with 0.15 wt. % Al, 1.0 wt. % Sc) closer to the substrate was also fixed at 1700 angstroms, and by adjusting the film thickness of the second metal layer (Cu layer with 0.15 wt. % Al and 1.0 wt. % Sc) of the highest layer, frequency shift due to mass addition effect was prevented.

Using these electrode films, reception side filters for antenna duplexer conforming to AMPS standard and transmission side filter for antenna duplexer conforming to AMPS standard were fabricated, and the electric power tolerance was tested on the reception side filters for antenna duplexer conforming to AMPS standard in the same manner as in embodiment 1. Herein, the life of each SAW filter was determined at a constant power application of 33 dBm. Results and the specific resistance after forming film and the insertion loss in the transmission side filter for antenna duplexer are shown in Table 5.

TABLE 4

| | | | Specific resistance | | Insertion loss (dB) | |
|---|---|---|---|---|---|---|
| | Electrode material Film thickness of each layer (Å) | Electrode construction | Right after forming film ($\mu\Omega \cdot$ cm) | After making device ($\mu\Omega \cdot$ cm) | max. | min. |
| Example 5 | Substrate/Ti/Al-0.15 wt % Sc-1.0 wt % Cu/Ti/Al (Substrate/200/1700/200/1700) | FIG. 8 | 3.62 | 3.61 | 2.18 | 1.21 |
| Example 6 | Substrate/Ti/Al-0.15 wt % Sc-1.0 wt % Cu/Ti/Al-1.0 wt % Cu (Substrate/200/1700/200/1700) | FIG. 8 | 3.70 | 3.69 | 2.20 | 1.23 |

TABLE 5

| Lowest layer Ti film thickness (Å) | Electrode material Film thickness of each layer (Å) | Electrode construction | Specific resistance | | Insertion loss (dB) | | Life (hours) |
| | | | Right after forming film ($\mu\Omega \cdot$ cm) | After making device ($\mu\Omega \cdot$ cm) | max. | min. | |
|---|---|---|---|---|---|---|---|
| 50 | Substrate/Ti/Al-0.15 wt % Sc-1.0 wt % Cu/Ti/Al-0.15 wt % Sc-1.0 wt % Cu (Substrate/50/1700/200/2000) | FIG. 2 | 3.79 | 3.77 | 2.10 | 1.20 | 2 |
| 80 | Substrate/Ti/Al-0.15 wt % Sc-1.0 wt % Cu/Ti/Al-0.15 wt % Sc-1.0 wt % Cu (Substrate/80/1700/200/1950) | FIG. 2 | 3.81 | 3.80 | 2.20 | 1.30 | 4 |
| 100 | Substrate/Ti/Al-0.15 wt % Sc-1.0 wt % Cu/Ti/Al-0.15 wt % Sc-1.0 wt % Cu (Substrate/100/1700/200/1900) | FIG. 2 | 3.81 | 3.81 | 2.20 | 1.30 | 8.5 |
| 150 | Substrate/Ti/Al-0.15 wt % Sc-1.0 wt % Cu/Ti/Al-0.15 wt % Sc-1.0 wt % Cu (Substrate/150/1700/200/1800) | FIG. 2 | 3.85 | 3.84 | 2.20 | 1.31 | 76 |
| 200 | Substrate/Ti/Al-0.15 wt % Sc-1.0 wt % Cu/Ti/Al-0.15 wt % Sc-1.0 wt % Cu (Substrate/200/1700/200/1700) | FIG. 2 | 3.91 | 3.90 | 2.23 | 1.31 | 98 |
| 300 | Substrate/Ti/Al-0.15 wt % Sc-1.0 wt % Cu/Ti/ | FIG. 2 | 4.04 | 4.03 | 2.28 | 1.52 | 106.5 |

TABLE 5-continued

| Lowest layer Ti film thickness (Å) | Electrode material Film thickness of each layer (Å) | Electrode construction | Specific resistance Right after forming film ($\mu\Omega \cdot cm$) | Specific resistance After making device ($\mu\Omega \cdot cm$) | Insertion loss (dB) max. | Insertion loss (dB) min. | Life (hours) |
|---|---|---|---|---|---|---|---|
| 400 | Al-0.15 wt % Sc-1.0 wt % Cu (Substrate/300/1700/200/1500) Substrate/Ti/Al-0.15 wt % Sc-1.0 wt % Cu/Ti/Al-0.15 wt % Sc-1.0 wt % Cu (Substrate/400/1700/200/1300) | FIG. 2 | 4.16 | 4.15 | 2.41 | 1.92 | 108 |
| 500 | Substrate/Ti/Al-0.15 wt % Sc-1.0 wt % Cu/Ti/Al-0.15 wt% Sc-1.0 wt % Cu (Substrate/500/1700/200/1100) | FIG. 2 | 4.28 | 4.26 | 2.55 | 2.04 | 95.5 |

As known from Table 5, the electric power tolerance is sufficiently high when the thickness of the first metal layer (Ti layer) contacting with the substrate is 150 angstroms or more. If the thickness of the first metal layer (Ti layer) contacting with the substrate is 100 angstroms, the electric power tolerance is slightly inferior, but it is in a practicable range. On the other hand, when the film thickness of the first metal layer (Ti layer) contacting with the substrate is 400 angstroms or more, the insertion loss is increased, and if over 500 angstroms, the insertion loss is too large to satisfy the required characteristics as the filter for antenna duplexer. Therefore, from the aspects of both passing characteristics and electric power tolerance, the film thickness of the first metal layer contacting with the substrate is preferred to be in a range of 100 to 500 angstroms.

Embodiment 5

In embodiment 5 of the invention, Ti was used as the first metal layer of which coefficient of diffusion to Al is smaller than the coefficient of self diffusion of Al, and Cu alloy with 0.15 wt. % of Al and 1.0 wt. % of Sc was used as the second metal layer composed of an Al alloy of three elements or more containing at least one or more metals which forms solid solution with Al at ordinary temperature, and at least one or more metals forming segregation at the grain boundary of Al or an intermetallic compound with Al at ordinary temperature, and moreover an electrode film having an electrode construction as shown in FIG. 2 was used. The film thickness of the second metal layer closer to the substrate was investigated in two cases:

EXAMPLE 7

2000 angstroms

Comparison 8

2500 angstroms

At this time, the first metal layer (Ti) was constant at 200 angstroms, and by adjusting the film thickness of the second metal layer of the highest layer, frequency shift due to mass addition effect was prevented.

Figure 10:
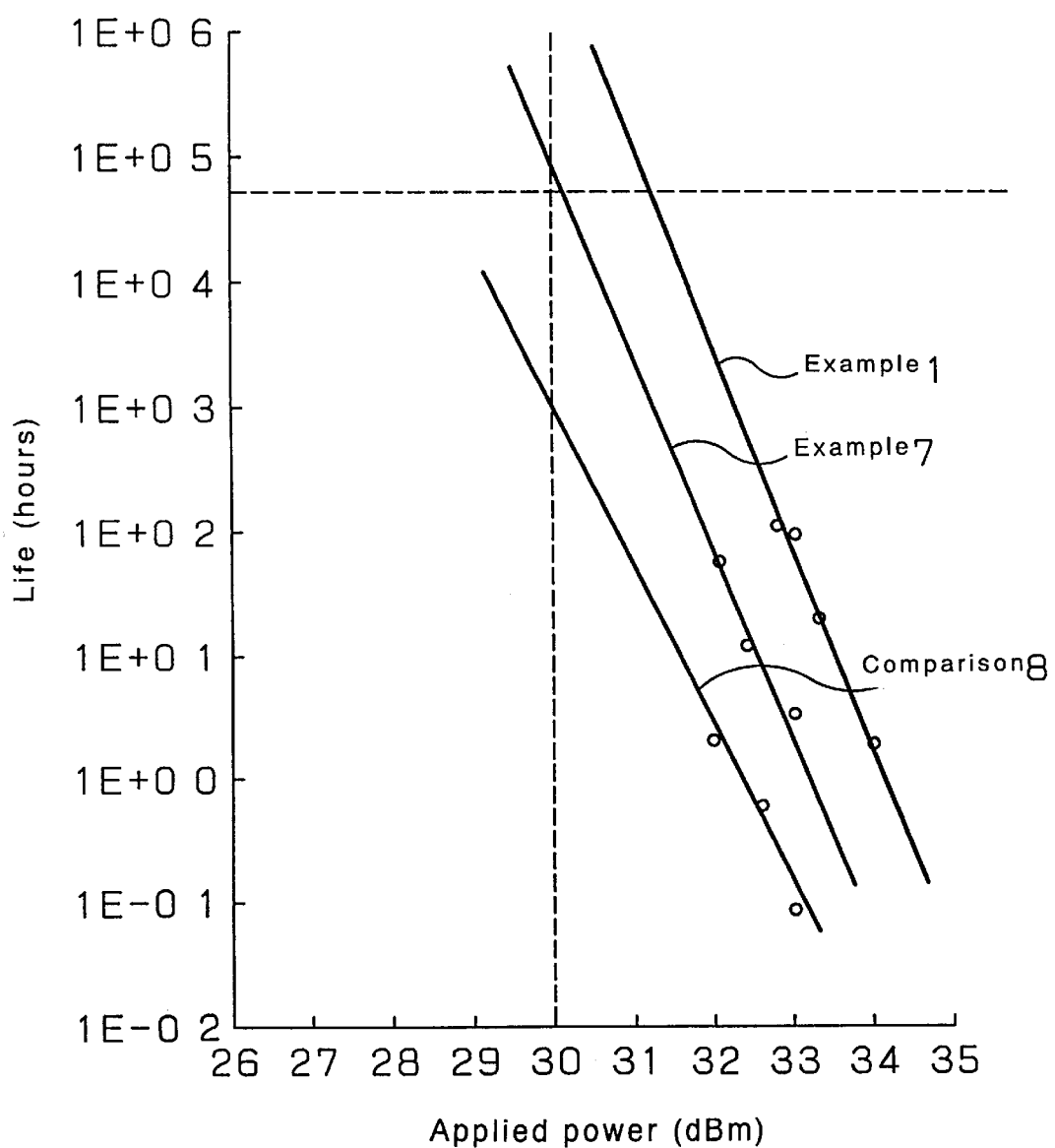
FIG. 10 is a characteristic diagram showing the relation between life of SAW filter and applied electric power in embodiment 5.

Using these electrode films, reception side filters for antenna duplexer conforming to AMPS standard and transmission side filter for antenna duplexer conforming to AMPS standard were fabricated, and the life and other characteristics were measured in the same manner as in embodiment 1. FIG. 10 shows the relation between the life and applied power in evaluation of electric power tolerance in the reception side filter for antenna duplexer. It also shows the result of example 1 of embodiment 1 (film thickness of second metal layer closer to substrate being 1700 angstroms).

As clear from FIG. 10, the electric power tolerance satisfies the requirement of 50,000 hours at 1 W when the film thickness of the second metal layer closer to the substrate is 2000 angstroms or less. It is hence known that the film thickness of the second metal layer closer to the substrate is preferred to be 2000 angstroms or less.

Embodiment 6

In embodiment 6 of the invention, Ti was used as the first metal layer of which coefficient of diffusion to Al is smaller than the coefficient of self diffusion of Al, and Sc was used as the metal of the second metal layer which forms solid solution with Al at ordinary temperature, and Cu as the metal forming segregation at the grain boundary of Al or an intermetallic compound with Al at ordinary temperature, and moreover using an electrode film having an electrode construction as shown in FIG. 2, a reception side filter for antenna duplexer conforming to AMPS standard was fabricated.

In the second metal layer, the Sc content was changed to 0.1 wt. %, 0.15 wt. % and 0.3 wt. % (at this time the content of Cu remained at 1.0 wt. %), and the Cu content was also changed to 0.5 wt. %, 1.0 wt. %, and 2.0 wt. % (at this time the content of Sc remained at 0.15 wt. %), and a total of six types were investigated. To evaluate the electric power tolerance, the life of the SAW filter was determined in the same manner as in embodiment 4 by applying an electric power of 33 dBm. Results are shown in Table 6.

The electric power tolerance was best at the Sc content of 0.15 wt. % which is the solid solution limit in Al at ordinary temperature, whereas it was improved along with the increase of the Cu content. Thus, in the second metal layer, the addition of the metal which forms solid solution with Al at ordinary temperature is preferred to be in a range not exceeding the solid solution limit at ordinary temperature, and the amount of the added metal forming segregation at the grain boundary of Al or an intermetallic compound with Al at ordinary temperature was more than the solid solution limit in Al at ordinary temperature.

TABLE 6

| Content of Sc (wt %) | Content of Cu (wt %) | Electrode material Film thickness of each layer (Å) | Electrode construction | Life (hours) |
|---|---|---|---|---|
| 0.10 | 1.0 | Substrate/Ti/Al-0.1 wt % Sc-1.0 wt % Cu/Ti/Al-0.1 wt % Sc-1.0 wt % Cu (Substrate/200/1700/200/1700) | FIG. 2 | 51 |
| 0.15 | 1.0 | Substrate/Ti/Al-0.15 wt % Sc-1.0 wt % Cu/Ti/Al-0.15 wt % Sc-1.0 wt % Cu (Substrate/200/1700/200/1700) | FIG. 2 | 98 |
| 0.30 | 1.0 | Substrate/Ti/Al-0.3 wt % Sc-1.0 wt % Cu/Ti/Al-0.3 wt % Sc-1.0 wt % Cu (Substrate/200/1700/200/1700) | FIG. 2 | 72 |
| 0.15 | 0.5 | Substrate/Ti/Al-0.15 wt % Sc-0.5 wt % Cu/Ti/Al-0.15 wt % Sc-0.5 wt % Cu (Substrate/200/1700/200/1700) | FIG. 2 | 54 |
| 0.15 | 1.0 | Substrate/Ti/Al-0.15 wt % Sc-1.0 wt % Cu/Ti/Al-0.15 wt % Sc-1.0 wt % Cu (Substrate/200/1700/200/1700) | FIG. 2 | 98 |
| 0.15 | 2.0 | Substrate/Ti/Al-0.15 wt % Sc-2.0 wt % Cu/Ti/Al-0.15 wt % Sc-2.0 wt % Cu (Substrate/200/1700/200/1700) | FIG. 2 | 171 |

Embodiment 7

In embodiment 7, the annealing effect was investigated by using the electrode film having an electrode construction as shown in FIG. 2, using Ti as the first metal layer of which coefficient of diffusion to Al is smaller than the coefficient of self diffusion of Al, and Cu alloy with 0.15 wt. % of Al and 0.5 wt. % of Sc as the second metal layer.

Using eight types of electrode films, without heat treatment after forming film, and heat treatment after forming film of 100° C. for 2 hours, 150° C. for 2 hours, 200° C. for 2 hours, 250° C. for 2 hours, 3()0° C. for 2 hours, 350° C. for 2 hours, and 400° C. for 2 hours, and reception side filters for antenna duplexer conforming to AMPS standard were fabricated. Annealing was done after forming film in vacuum state in wafer state before forming pattern.

Figure 11:
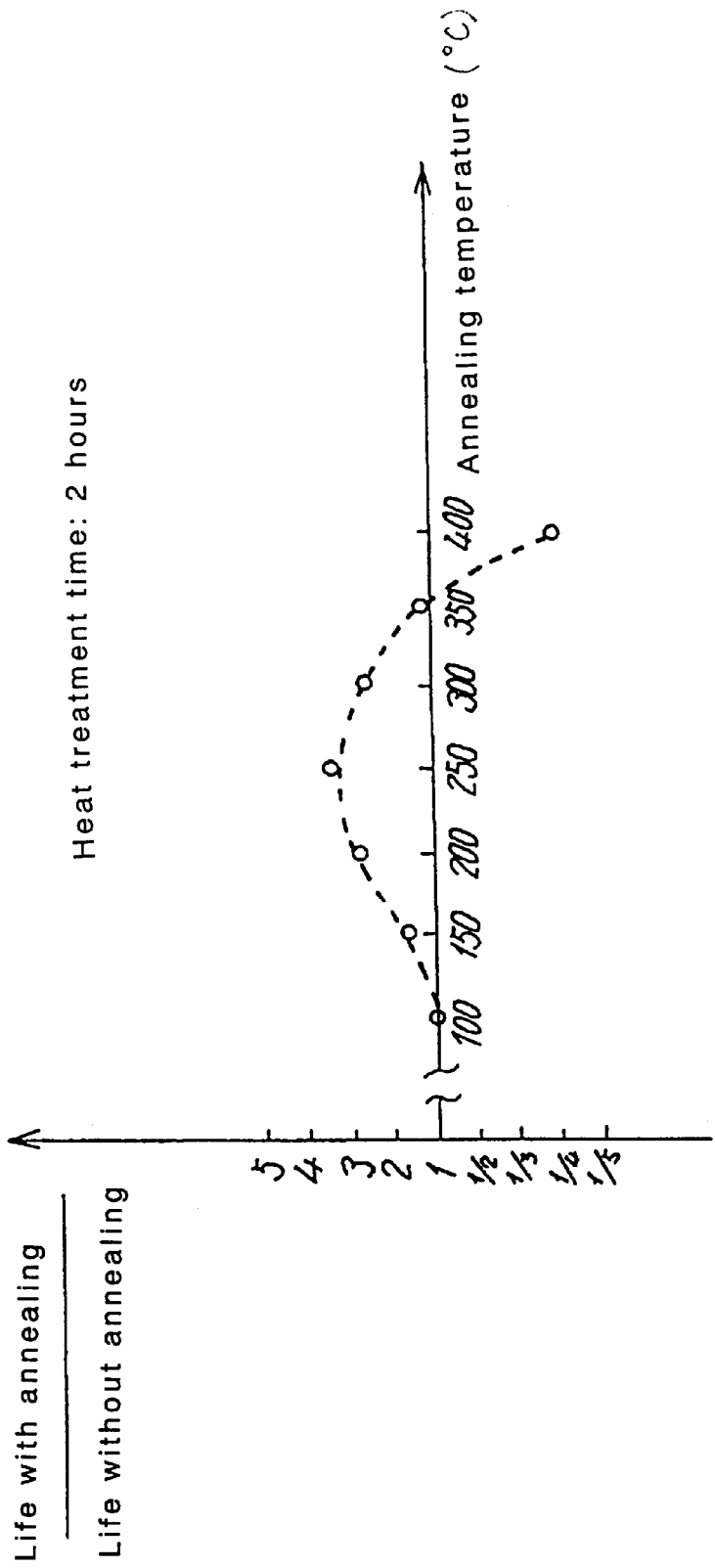
FIG. 11 is a characteristic diagram showing the relation between the heat treatment temperature and electric power tolerance of SAW filter in embodiment 7.

In these SAW filters, the electric power tolerance was tested by applying an electric power of 33 dBm same as in embodiment 4, and the life of each SAW filter was determined. Results are shown in FIG. 11. In FIG. 11, each life is expressed by the value standardized by the life of the non-annealed SAW filter. The section of the electrode film after annealing was observed, and no change was observed in the laminated structure itself, but in samples heated at 250° C. or higher, the particle size of the Cu film with 0.15 wt. % of Al and 1.0 wt. % of Sc in the second metal layer was lager than in the non-annealed sample. It is estimated to be the reason why improvement of electric power tolerance by annealing is limited at the peak of annealing temperature of around 250° C., and it seems to be also the cause of impairing the electric power tolerance at over 350° C.

Further, in the sample annealed at 400° C. or higher, the insertion loss was increased and the electric characteristics of the SAW filter was impaired. As a result of analysis, it was found that Ti, constituent of the electrode film, formed an alloy layer with Cu with 0.15 wt. % of Al and 1.0 wt. % of Sc, which caused to increase the specific resistance of the film.

The following facts were obtained from these results, that is, the electric power tolerance can be further improved by annealing, the annealing temperature is preferred to be in a range of 150 to 350° C. so as not to increase the particle size of Al alloy of the second metal layer, and the temperature condition must be selected so as not to form alloy film by the first metal layer and second metal layer. As a matter of course, the process temperature from forming of film to packaging is preferred to be 350° C. or less.

Besides, by operating at electric power of 1 W, the heat generation of the SAW filter by power feeding was investigated. As a result, the chip temperature was about 150° C. Heat generation by power feeding varies significantly depending on the design of SAW filter and operating condition of SAW filter (ambient temperature, operating electric power, etc.), and in order to prevent Ti from diffusing into the Al alloy, the chip temperature in the practical operating condition is preferred to be 400° C. or less, or more preferably 350° C. or less. When the electrode material of the invention is used in the SAW filter used in such design and operating condition, the electric power tolerance is improved significantly.

Embodiment 8

A ladder type SAW filter having SAW resonators of first stage for receiving electric power arranged in series was fabricated by using the electrode film having an electrode construction in examples 3 and 4 in embodiment 2, and the life was measured by performing the electric power tolerance test in the same manner as in embodiment 1.

Figure 12:
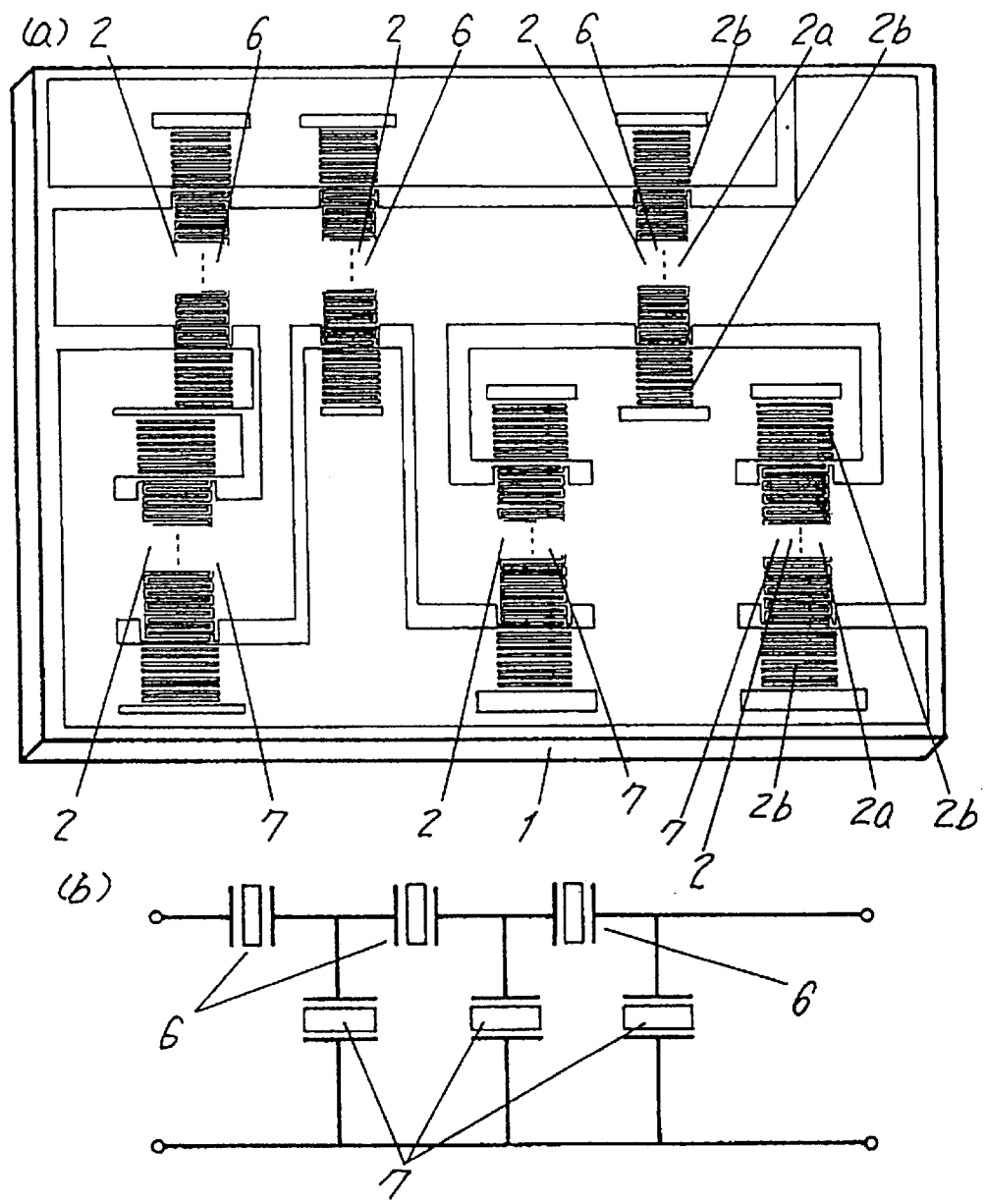
FIG. 12 (a) is a schematic diagram of SAW filter used in embodiment 8.

FIG. 12 (a) is a perspective view of the SAW filter in embodiment 8, and FIG. 12 (b) shows a structural diagram. In FIG. 12, reference numeral 6 shows SAW resonators arranged in series, and 7 denotes SAW resonators arranged in parallel. FIG. 13 is a conceptual diagram showing the relation between impedance characteristics and filter characteristics of SAW resonators arranged in series and SAW resonators arranged in parallel.

In FIG. 13, reference numeral 8 is the filter characteristics, 9 is the impedance characteristics of SAW resonators arranged in parallel, 10 is the impedance characteristics of SAW resonators arranged in series, 11 is the series resonance point of parallel SAW resonators, 12 is the parallel resonance point of parallel SAW resonators, 13 is the series resonance point of series SAW resonators, and 14 is the parallel resonance point of series SAW resonators.

As known from FIG. 13, in the case of ladder type SAW filter, the characteristics of the low frequency side of the filter characteristics is formed by the SAW resonator disposed in parallel, and the characteristics of the high frequency side of the filter characteristics is formed by the SAW resonator disposed in series. Therefore, in the system in which the reception band is disposed at the low frequency side of the transmission band, the signal leaking from the transmission side is applied to the attenuation region of the lower frequency side than the band of the reception side filter, that is, near the resonance point of the SAW resonator disposed in parallel.

Accordingly, when realizing the reception side filter for antenna duplexer by the ladder type SAW filter, in the SAW filter shown in FIG. 1 in which SAW resonators are arranged in parallel in the input side first stage used in embodiments 1 to 7, most of the leak signal from the transmission side flows into the ground potential in one stage of resonators arranged in parallel in the first stage, and the electric power is applied to near the resonance point of the SAW resonators arranged in parallel to the electrode. In the SAW resonators, the resonance point is the point where the electrode is most widely excited, and the electrode is most likely to deteriorate.

Figure 14:
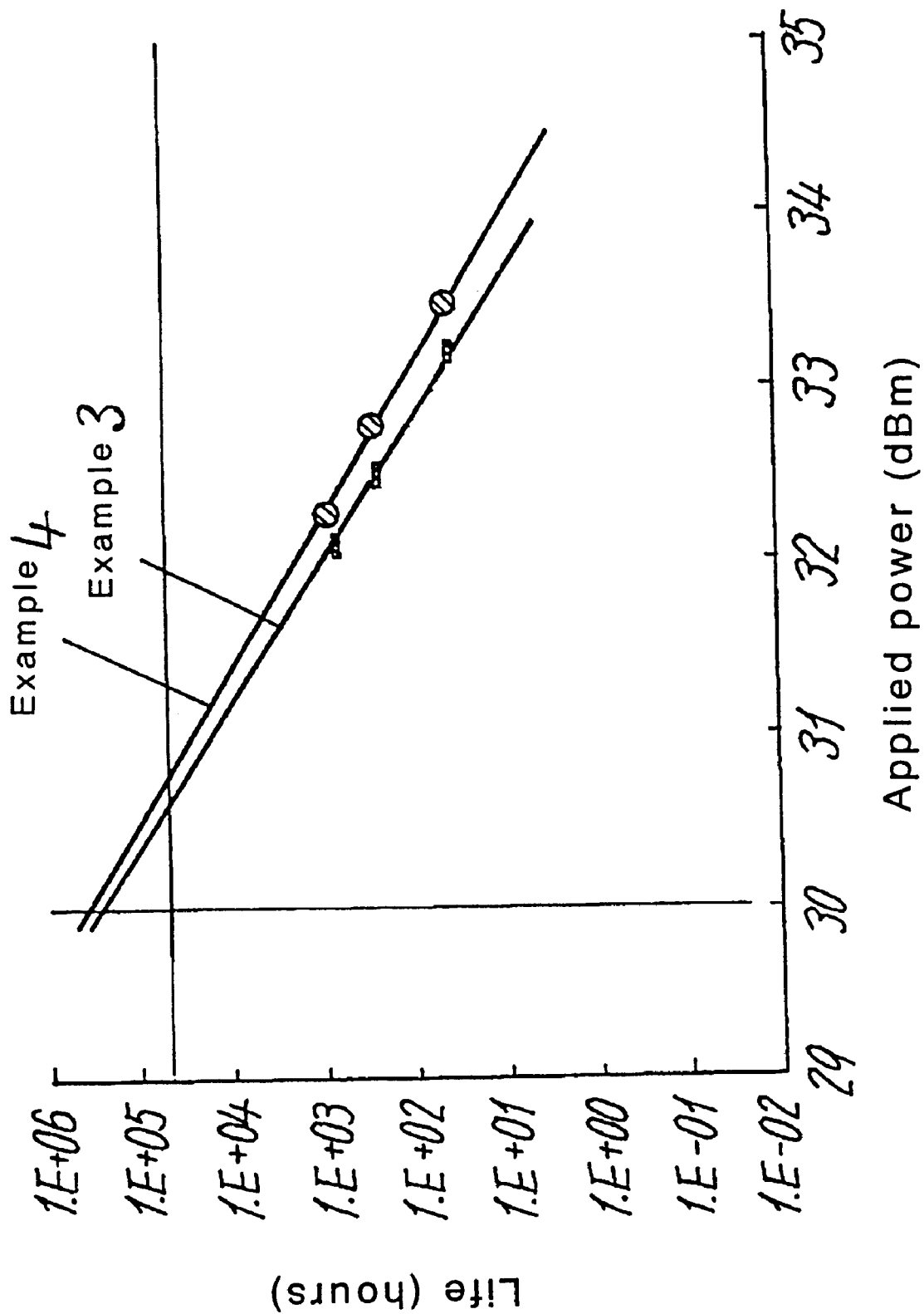
FIG. 14 is a characteristic diagram showing the relation between life of SAW filter and applied electric power in embodiment 8.

By contrast, as in embodiment 8, in the case of the SAW filter shown in FIG. 12 in which SAW resonators are arranged in series in the first stage, most of the leak signal from the transmission side flows into the ground in two stages, that is, the SAW resonators arranged in series in the first stage, and the SAW resonators arranged in parallel next thereto, so that the electric power applied to the SAW resonators arranged in parallel can be alleviated. In the SAW resonators arranged in series in the first stage, since the leak signal of transmission side is largely deviated from the resonance point, the electrode is not excited largely. As a result, the electric power tolerance can be enhanced in design. FIG. 14 shows results of electric power tolerance test. In the SAW filters of examples 3 and 4, the life was insufficient as shown in FIG. 7 in the results evaluated in the circuit constitution having the first stages arranged in parallel shown in FIG. 1, but when used in the circuit in which the first stages are arranged in series as shown in FIG. 12, all samples proved the life over 50,000 hours at 1 W, and it is sufficiently usable as the reception side filter for antenna duplexer.

In the foregoing embodiments 1 to 7, Ti is used as the first metal layer of which coefficient of diffusion to Al is smaller than the coefficient of self diffusion of Al, and as the second metal layer, Sc is used as at least one or more metals which forms solid solution with Al at ordinary temperature, and Cu is used as at least one or more metals forming segregation at the grain boundary of Al or an intermetallic compound with Al at ordinary temperature, but not limited to this, as the first metal layer of which coefficient of diffusion to Al is smaller than the coefficient of self diffusion of Al, at least one or more materials may be selected from the metals of high melting point (Ti, Zr, Hf, V, Nb, Ta, Cr, Mo, W, HfN, HfC, ZrN, ZrC, TaC, TiW, TiN), and the same effects are obtained. In the second metal layer, as the metal which forms solid solution with Al at ordinary temperature, by using at least one or more metals selected from the group consisting of Sc, gallium, hafnium, zinc, lithium, zirconium, titanium and magnesium, and as the metal forming segregation at the grain boundary of Al or an intermetallic compound with Al at ordinary temperature, by using at least one or more metals selected from the group consisting of germanium, copper, palladium and silicon, similar effects are obtained, and the electrode film excellent in electric power tolerance can be obtained.

In the electrodes of the examples, there are plural layers of the first metal layer or second metal layer, but the first metal layer or second metal layer used in each layer is not required to be same material or same composition, or uniform in film thickness.

INDUSTRIAL APPLICABILITY

As described herein, the invention presents the SAW device excellent in electric power tolerance, stable thermally, capable of preventing increase of insertion loss, and compatible with conventional pattern forming technique. Therefore, the SAW device can be used in the duplexer of a portable telephone in which a large electric power is applied, so that the antenna duplexer can be reduced in size and weight.

What is claimed is:

1. A surface acoustic wave device having an electrode, said electrode comprising at least two laminated bodies, each laminated body having a second metal layer stacked up on a first metal layer, wherein said at least two laminated bodies are stacked on a substrate, wherein the first metal layer is composed of a metal of which coefficient of diffusion to Al is smaller than the coefficient of self diffusion of Al, and the second metal layer is composed of an Al alloy comprising at least three elements, said at least three elements including at least one metal which forms solid solution with Al at ordinary temperature, and said at least three elements farther including one from the group consisting of at least one metal forming segregation all the grain boundary of Al in said Al alloy or forming an intermetallic compound with Al in said Al alloy at ordinary temperature.

2. A surface acoustic wave device having an electrode comprising at least one laminated body, said at least one laminated body including a first metal layer having a first and second side, a second metal layer, and a third metal layer, said second metal layer disposed on said first side of said first metal layer and said third metal layer disposed on said second side of said first metal layer, said laminated body disposed on a substrate, wherein the second metal layer and third metal layer are each composed of an Al alloy comprising at least three elements, said at least three elements including at least one metal which forms solid solution with Al at ordinary temperature, and said at least three elements further including one from the group consisting of at least one metal forming segregation at the grain boundary of Al in said Al alloy or forming an intermetallic compound with Al in said Al alloy at ordinary temperature, and the first metal layer is composed of a metal of which coefficient of diffusion to Al is smaller than the coefficient of self diffusion of Al.

3. A surface acoustic wave device having an electrode comprising at least one laminated body, said at least one laminated body including a first metal layer having a first and second side, a second metal layer, and a third metal layer, said second metal layer disposed on said first side of said first metal layer and said third metal layer disposed on said second side of said first metal layer, said laminated body disposed on a substrate, wherein the second metal layer is composed of an Al alloy comprising at least three elements, said at least three elements including at least one metal which forms solid solution with Al at ordinary temperature, and said at least three elements further including one from the group consisting of at least one metal forming segregation at the grain boundary of Al or forming an intermetallic compound with Al at ordinary temperature, and the first metal layer is composed of a metal of which coefficient of diffusion to Al is smaller than the coefficient of self diffusion of Al, said third metal layer is located farther from said substrate than said second metal layer, wherein said third metal layer is lower in sheet resistance than said second metal layer, said third metal layer is composed of an Al alloy of at least two elements different in type or composition from the Al alloy forming said second metal layer.

4. A surface acoustic wave device of claim 1, wherein the first metal layer of one of said at least two laminated bodies contacts said substrate, said first metal layer of one of said at least two laminated bodies has a film thickness of 100 angstroms to 500 angstroms.

5. A surface acoustic wave device of claim 1, wherein the second metal layer of one of said at least two laminated bodies located closer to said substrate than the second metal layer of the other of said at least two laminated bodies has a film thickness of 2000 angstroms or less.

6. A surface acoustic wave device of any one of claims 1, 2 or 3, wherein said first metal layer is further composed of Al.

7. A surface acoustic wave device of any one of claims 1, 2, 4, 5 or 3, wherein the content of said at least one metal which forms solid solution with Al at ordinary temperature is in a range not exceeding the solid solution limit at ordinary temperature, and the content of said at least one metal forming segregation at the grain boundary of Al or forming an intermetallic compound with Al at ordinary temperature is more than the solid solution limit to Al at ordinary temperature.

8. A surface acoustic wave device of any one of claims 1, 2, 4, 5 or 3, wherein said at least one metal which forms solid solution with Al at ordinary temperature is selected from the group consisting of scandium, gallium, hafnium, zinc, lithium, zirconium, titanium and magnesium, and said at least one metal forming segregation at the grain boundary of Al or forming an intermetallic compound with Al at ordinary temperature is selected from the group consisting of germanium, copper, palladium and silicon.

9. A surface acoustic wave device of claim 8, wherein said at least one metal which forms solid solution with Al at ordinary temperature is scandium, and said at least one metal forming segregation at the grain boundary of Al or forming an intermetallic compound with Al at ordinary temperature is copper.

10. A surface acoustic wave device of any one of claims 1, 2, 4, 5 or 3, wherein said first metal layer is composed of a metal of high melting point selected from the group consisting of Ti, Zr, Hf, V, Nb, Ta, Cr, Mo, W, HfN, HfC, ZrN, ZrC, TaC, TiW, and TiN.

11. A surface acoustic wave device of claim 10, wherein said metal of high melting point is Ti.

12. A surface acoustic wave device of any one of claims 1, 2, 4, 5 or 3, wherein said surface acoustic wave device is manufactured according to a method comprising the steps of: forming said first metal layer and second metal layer by DC magnetron sputtering, heating at a temperature of 150 to 350° C., and patterning by reactive ion etching.

13. A reception filter for an antenna duplexer having the reception band set at the low frequency side of the transmission band, said reception filter being a surface acoustic wave filter for realizing filter characteristics by connecting a plurality of surface acoustic wave resonators in series-parallel ladder type, wherein the surface acoustic wave resonator in the initial stage for receiving the electric power is disposed in series and includes an electrode, the electrode having the structure as set forth in any one of claims 1, 2, 4, 5 or 3.

14. A mobile communication equipment having an antenna duplexer, said mobile communication equipment using a surface acoustic wave device as set forth in any one of claims 1, 2, 4, 5 or 3, in the antenna duplexer of said mobile communication equipment.

15. A surface acoustic wave device of claims 2 or 3, wherein the second metal layer is closer to said substrate than said third metal layer, said second metal layer has a film thickness of 2000 angstroms or less.

* * * * *